(12) United States Patent
Ward et al.

(10) Patent No.: US 10,014,249 B2
(45) Date of Patent: Jul. 3, 2018

(54) CIRCUIT BOARD AND SMART CARD MODULE AND SMART CARD UTILIZING THE SAME

(71) Applicant: Johnson Electric S.A., Murten (CH)

(72) Inventors: Dominic John Ward, Carisbrooke (GB); Rong Zhang, Shanghai (CN); Yi Qi Zhang, Shanghai (CN)

(73) Assignee: Johnson Electric S.A., Murten (CH)

( * ) Notice: Subject to any disclaimer, the term of this patent is extended or adjusted under 35 U.S.C. 154(b) by 0 days.

(21) Appl. No.: 15/422,795

(22) Filed: Feb. 2, 2017

(65) Prior Publication Data

US 2017/0221807 A1   Aug. 3, 2017

(30) Foreign Application Priority Data

Feb. 2, 2016   (CN) .......................... 2016 1 0073310

(51) Int. Cl.
*H01L 23/498*   (2006.01)
*H01L 23/544*   (2006.01)

(52) U.S. Cl.
CPC .... *H01L 23/49855* (2013.01); *H01L 23/4985* (2013.01); *H01L 23/49827* (2013.01);
(Continued)

(58) Field of Classification Search
CPC ......... H01L 23/49894; H01L 23/49855; H01L 23/4985; H01L 23/49838; H01L 23/49827; H01L 23/544; H01L 2223/54426; H01L 24/01; H01L 2224/01; H01L 2924/151; H01L 23/49513; H01L 23/49503; H01L 2924/1015; H01L 2924/1515; H01L 2924/15323; H01L 2924/1532; H01L 2924/153; H01L 2224/29015; H01L 2224/29026; H01L 2224/29035; H01L 2224/29034; H05K 2201/09; H05K 2201/09272; H05K 2201/09254; H05K 2201/09218; H05K 2201/094;
(Continued)

(56) References Cited

U.S. PATENT DOCUMENTS 4,942,495 A * 7/1990 Peres .......................... H01T 4/08
361/220
4,970,780 A * 11/1990 Suda .................... H01L 23/5328
257/E21.511
(Continued)

FOREIGN PATENT DOCUMENTS

DE   102017100420 A1 *  8/2017   ....... H01L 23/49838
DE   102017100421 A1 *  8/2017   ....... H01L 23/49827
JP      60240143 A   * 11/1985   ....... H01L 21/76897

*Primary Examiner* — Earl Taylor
(74) *Attorney, Agent, or Firm* — Muncy, Geissler, Olds & Lowe, P.C.

(57) ABSTRACT

A circuit board and a smart card module and a smart card employing the circuit board are provided. The circuit board includes a substrate and a pad region provided on the substrate. The pad region is configured for mounting an electronic component. The pad region comprises a plurality of pads spaced from each other and traces connected to their respective pads. At least one of the traces comprises an extension which extends along a perimeter of the pad region. The present invention provides a reliable adhesion between the chip and pad region.

19 Claims, 6 Drawing Sheets

US 10,014,249 B2
Page 2

(52) U.S. Cl.
CPC .. *H01L 23/49838* (2013.01); *H01L 23/49894* (2013.01); *H01L 23/544* (2013.01); *H01L 2223/54426* (2013.01)

(58) Field of Classification Search
CPC .......... H05K 2201/09372; H05K 2201/09281; H05K 2201/09445; H05K 2201/09427; H05K 2201/09418; H05K 2224/0912; H05K 1/115; H05K 1/0268; H05K 1/0266; H05K 1/0275; H05K 1/269; H05K 1/189; G06K 19/07737; G06K 19/077; G06K 19/07747; G06K 19/07745; G06K 19/10; G06K 19/067
See application file for complete search history.

(56) References Cited

U.S. PATENT DOCUMENTS

| | | | | |
|---|---|---|---|---|
| 5,021,865 A * | 6/1991 | Takahashi | ......... | H01L 23/49503 257/676 |
| D327,883 S * | 7/1992 | Gloton | ......... | D13/182 |
| D328,599 S * | 8/1992 | Gloton | ......... | D13/182 |
| D331,922 S * | 12/1992 | Gloton | ......... | D14/437 |
| D335,663 S * | 5/1993 | Gloton | ......... | D14/437 |
| D342,728 S * | 12/1993 | Gloton | ......... | D14/437 |
| D344,502 S * | 2/1994 | Gloton | ......... | D14/437 |
| D353,135 S * | 12/1994 | Gloton | ......... | D14/437 |
| D353,136 S * | 12/1994 | Gloton | ......... | D14/437 |
| D357,242 S * | 4/1995 | Gloton | ......... | D14/437 |
| D357,909 S * | 5/1995 | Gloton | ......... | D14/437 |
| D358,142 S * | 5/1995 | Gloton | ......... | D14/437 |
| 5,598,032 A * | 1/1997 | Fidalgo | ......... | G06K 19/07747 235/492 |
| D393,458 S * | 4/1998 | Merlin | ......... | D14/437 |
| 5,859,474 A * | 1/1999 | Dordi | ......... | H01L 23/3128 257/737 |
| D412,164 S * | 7/1999 | Laviron | ......... | D14/437 |
| 5,975,420 A * | 11/1999 | Gogami | ......... | G06K 19/07728 235/488 |
| 6,054,774 A * | 4/2000 | Ohmori | ......... | G06K 19/07743 257/679 |
| D425,519 S * | 5/2000 | Merlin | ......... | D14/436 |
| 6,191,951 B1 * | 2/2001 | Houdeau | ......... | G06K 19/07743 235/492 |
| 6,259,035 B1 * | 7/2001 | Truggelmann | ......... | C23C 2/04 174/250 |
| 6,291,899 B1 * | 9/2001 | Wensel | ......... | H01L 21/565 257/729 |
| 6,316,289 B1 * | 11/2001 | Chung | ......... | H01L 21/4867 257/E21.508 |
| 6,326,683 B1 * | 12/2001 | Houdeau | ......... | G06K 19/07743 257/668 |
| D456,414 S * | 4/2002 | Turin | ......... | D14/437 |
| 6,370,029 B1 * | 4/2002 | Kawan | ......... | G06K 19/07743 174/260 |
| 6,568,600 B1 * | 5/2003 | Carpier | ......... | G06K 19/07749 235/487 |
| 6,570,259 B2 * | 5/2003 | Alcoe | ......... | H01L 21/563 174/539 |
| 6,603,199 B1 * | 8/2003 | Poddar | ......... | H01L 23/49838 257/678 |
| 6,639,322 B1 * | 10/2003 | Welstand | ......... | H01L 21/563 257/728 |
| 6,642,611 B2 * | 11/2003 | Iwasaki | ......... | G06K 19/07739 235/380 |
| 6,803,666 B2 * | 10/2004 | Takahashi | ......... | H01L 23/49838 257/773 |
| 6,817,534 B2 * | 11/2004 | Gray | ......... | G06K 19/072 235/441 |
| 6,896,189 B2 * | 5/2005 | Guion | ......... | G06K 19/07733 235/451 |
| 7,064,423 B2 * | 6/2006 | Okita | ......... | G06K 19/07728 174/250 |
| 7,121,473 B2 * | 10/2006 | Boker | ......... | G06K 19/07732 235/375 |
| D534,537 S * | 1/2007 | Smith | ......... | D14/437 |
| 7,265,994 B2 * | 9/2007 | Danvir | ......... | H05K 3/305 174/260 |
| 7,630,209 B2 * | 12/2009 | Kim | ......... | G06K 19/077 174/260 |
| 7,855,895 B2 * | 12/2010 | Kim | ......... | G06K 19/077 174/260 |
| 7,874,491 B2 * | 1/2011 | Janke | ......... | G06K 19/07735 235/492 |
| 8,143,713 B2 * | 3/2012 | Song | ......... | H01L 23/49855 257/203 |
| 8,629,547 B2 * | 1/2014 | Cho | ......... | H01L 23/13 174/250 |
| 8,649,820 B2 * | 2/2014 | Schwandt | ......... | G06K 19/07732 455/557 |
| 8,870,080 B2 * | 10/2014 | Finn | ......... | G06K 19/07769 235/492 |
| 8,898,365 B2 * | 11/2014 | Masleid | ......... | H01L 23/66 710/305 |
| 8,936,199 B2 * | 1/2015 | Lepp | ......... | G06K 19/0719 235/487 |
| 9,070,067 B2 * | 6/2015 | Hoegerl | ......... | G06K 19/07728 |
| 9,112,272 B2 * | 8/2015 | Finn | ......... | G06K 19/07769 |
| 9,135,549 B2 * | 9/2015 | Hoegerl | ......... | G06K 19/07707 |
| 9,251,457 B2 * | 2/2016 | Salle | ......... | G06K 19/07743 |
| 9,251,458 B2 * | 2/2016 | Finn | ......... | G06K 19/07769 |
| 9,272,370 B2 * | 3/2016 | Finn | ......... | H01Q 1/2225 |
| D756,317 S * | 5/2016 | Finn | ......... | D13/182 |
| 9,355,348 B2 * | 5/2016 | Guijarro | ......... | G06K 19/077 |
| 9,390,364 B2 * | 7/2016 | Finn | ......... | G06K 19/07754 |
| 9,418,929 B1 * | 8/2016 | Low | ......... | H01L 23/49838 |
| 9,475,086 B2 * | 10/2016 | Finn | ......... | B23K 26/361 |
| 9,481,499 B2 * | 11/2016 | Zhang | ......... | B65D 65/22 |
| 9,619,744 B2 * | 4/2017 | Ward | ......... | G06K 19/0772 |
| 9,622,359 B2 * | 4/2017 | Finn | ......... | H05K 3/46 |
| 9,634,391 B2 * | 4/2017 | Finn | ......... | G06K 19/07747 |
| 9,786,625 B2 * | 10/2017 | Yang | ......... | H01L 24/27 |
| 9,799,598 B2 * | 10/2017 | Eymard | ......... | H01L 23/49855 |
| 2002/0140110 A1 * | 10/2002 | Takahashi | ......... | H01L 23/49838 257/784 |
| 2002/0194729 A1 * | 12/2002 | Kuribayashi | ......... | H05K 13/0465 29/834 |
| 2003/0024996 A1 * | 2/2003 | Muehlberger | ......... | G06K 7/0004 235/492 |
| 2004/0150967 A1 * | 8/2004 | Danvir | ......... | H05K 3/305 361/767 |
| 2004/0169521 A1 * | 9/2004 | Rincon | ......... | G01R 1/07378 324/756.03 |
| 2004/0256150 A1 * | 12/2004 | Barchmann | ......... | G06K 19/07743 174/266 |
| 2005/0007744 A1 * | 1/2005 | Okita | ......... | G06K 19/07728 361/728 |
| 2005/0087356 A1 * | 4/2005 | Forcier | ......... | B81C 1/0023 174/558 |
| 2005/0251777 A1 * | 11/2005 | Bartley | ......... | H01L 23/49827 174/266 |
| 2006/0139901 A1 * | 6/2006 | Meireles | ......... | G06K 19/07745 361/760 |
| 2006/0185895 A1 * | 8/2006 | Kalidas | ......... | H01L 23/49838 174/261 |
| 2007/0013396 A1 * | 1/2007 | Kim | ......... | G06K 19/077 361/767 |
| 2007/0158440 A1 * | 7/2007 | Nishizawa | ......... | G06K 19/077 235/492 |
| 2008/0205012 A1 * | 8/2008 | Heinemann | ......... | G06K 19/07743 361/767 |
| 2009/0278264 A1 * | 11/2009 | Topacio | ......... | H01L 23/49811 257/779 |
| 2010/0038438 A1 * | 2/2010 | Kim | ......... | G06K 19/077 235/492 |
| 2011/0156271 A1 * | 6/2011 | Kawabata | ......... | H01L 23/49838 257/774 |
| 2011/0279717 A1 * | 11/2011 | Wakiyama | ......... | H01L 21/563 348/294 |

(56) References Cited

U.S. PATENT DOCUMENTS

| | | | |
|---|---|---|---|
| 2012/0074540 A1* | 3/2012 | Cho | H01L 23/13 257/659 |
| 2013/0126622 A1* | 5/2013 | Finn | G06K 19/07771 235/492 |
| 2013/0254448 A1* | 9/2013 | Masleid | H01L 23/66 710/305 |
| 2014/0014732 A1* | 1/2014 | Finn | G06K 19/077 235/492 |
| 2014/0021264 A1* | 1/2014 | Pueschner | H01L 23/49811 235/492 |
| 2014/0063723 A1* | 3/2014 | Ro | H01L 21/4853 361/679.32 |
| 2014/0117097 A1* | 5/2014 | Bosquet | G06K 7/0013 235/492 |
| 2014/0264789 A1* | 9/2014 | Yang | H01L 24/27 257/666 |
| 2014/0306016 A1* | 10/2014 | Salle | G06K 19/07743 235/492 |
| 2014/0353387 A1* | 12/2014 | Hoegerl | G06K 19/07728 235/492 |
| 2014/0353822 A1* | 12/2014 | Oyachi | H01L 23/49811 257/737 |
| 2014/0360759 A1* | 12/2014 | Kunieda | H01L 21/4846 174/251 |
| 2014/0368299 A1* | 12/2014 | Yamashita | H03H 9/059 333/195 |
| 2015/0021403 A1* | 1/2015 | Finn | G06K 19/07747 235/492 |
| 2015/0129665 A1* | 5/2015 | Finn | G06K 19/07747 235/492 |
| 2015/0324683 A1* | 11/2015 | Linfield | G06K 19/07769 235/492 |
| 2015/0325511 A1* | 11/2015 | Yang | H01L 24/27 257/762 |
| 2015/0338451 A1* | 11/2015 | Petivan | G01R 31/041 324/538 |
| 2015/0339565 A1* | 11/2015 | Pueschner | H01L 23/49883 235/488 |
| 2016/0105961 A1* | 4/2016 | Dieu-Gomont | H01L 23/49855 174/254 |
| 2016/0190046 A1* | 6/2016 | Fontana | H01L 21/561 257/676 |
| 2016/0293536 A1* | 10/2016 | Eymard | H01L 23/49827 |
| 2016/0365644 A1* | 12/2016 | Finn | B23K 26/40 |
| 2017/0039462 A1* | 2/2017 | Demaso | G06K 19/044 |
| 2017/0062358 A1* | 3/2017 | Pueschner | H01L 23/562 |
| 2017/0092612 A1* | 3/2017 | Zenz | G06K 19/07749 |
| 2017/0140257 A1* | 5/2017 | Zenz | H01L 24/48 |
| 2017/0221806 A1* | 8/2017 | Ward | H01L 23/293 |
| 2017/0221807 A1* | 8/2017 | Ward | H01L 23/06 |

* cited by examiner

CIRCUIT BOARD AND SMART CARD MODULE AND SMART CARD UTILIZING THE SAME

CROSS REFERENCE TO RELATED APPLICATIONS

This non-provisional patent application claims priority under 35 U.S.C. § 119(a) from Patent Application No. 201610073310.5 filed in The People's Republic of China on Feb. 2, 2016.

FIELD OF THE INVENTION

This invention relates to a circuit board, a smart card module and a smart card employing the circuit board.

BACKGROUND OF THE INVENTION

With the development of human society, communication devices and identification devices have become more and more widely used. The use of smart cards and associated identification devices has brought greatly improved safety and convenience to people's travel.

A smart card, also referred to as an IC card, is a portable plastic card with an IC chip adhered thereon or embedded therein. The card includes a microprocessor, an I/O interface and a memory, which provides functions of computing, access control and storage of data. The size and connecting terminals of the card are specified by relevant ISO standards such as ISO7810. Common smart cards include telephone IC cards, identification IC cards, and some transport tickets and memory cards.

The smart card includes a card body and a smart card module mounted on the card body. The smart card module includes a circuit board and electronic components (such as a chip) mounted on the circuit board. Due to its light weight, small thickness, the circuit board has been widely used in various electronic devices, such as cell phones, notebook computers, tablet PCs and liquid crystal displays (LCDs).

In currently available circuit board products, an adhesive layer between the chip and the circuit board has strong flowability and is inclined to flow randomly, which may result in some area in the pad region has no adhesive layer and some area outside of the pad region has the adhesive layer. This may cause poor adhesion between the chip and the circuit board and reduced reliability of the circuit board.

SUMMARY OF THE INVENTION

Thus there is a desire for a new circuit board with improved reliability and a smart card module and a smart card using the circuit board, which can address the poor adhesion result.

In one aspect, an circuit board is provided which includes a substrate and a pad region provided on the substrate. The pad region is configured for mounting an electronic component. The pad region comprises a plurality of pads spaced from each other and traces connected to their respective pads. At least one of the traces comprises an extension which extends along a perimeter of the pad region.

In another aspect, a smart card module is provided. The smart card module includes a chip and the above-described circuit board. The chip is mounted to the pad region of the circuit board for mounting the chip.

In still another aspect, a smart card is provided which includes a card body. The card body defines a groove. The smart card further includes the above-described smart card module, and the smart card module is disposed in the groove of the card body.

In various embodiments of the present invention, the adhesive can flow along the pad region and can be uniformly applied in the pad region under the guiding and blocking of the plurality of extensions. The extensions can block the adhesive from flowing to an area outside the pad region, thus avoiding non-uniform applying and arbitrary flowing of the adhesive.

DETAILED DESCRIPTION OF THE PREFERRED EMBODIMENTS

The technical solutions of the embodiments of the present invention will be clearly and completely described as follows with reference to the accompanying drawings. Apparently, the embodiments as described below are merely part of, rather than all, embodiments of the present invention. Based on the embodiments of the present disclosure, any other embodiment obtained by a person skilled in the art without paying any creative effort shall fall within the protection scope of the present invention.

It is noted that, when a component is described to be "fixed" to another component, it can be directly fixed to the another component or there may be an intermediate component. When a component is described to be "connected" to another component, it can be directly connected to the another component or there may be an intermediate component. When a component is described to be "disposed" on another component, it can be directly disposed on the another component or there may be an intermediate component.

Figure 1:
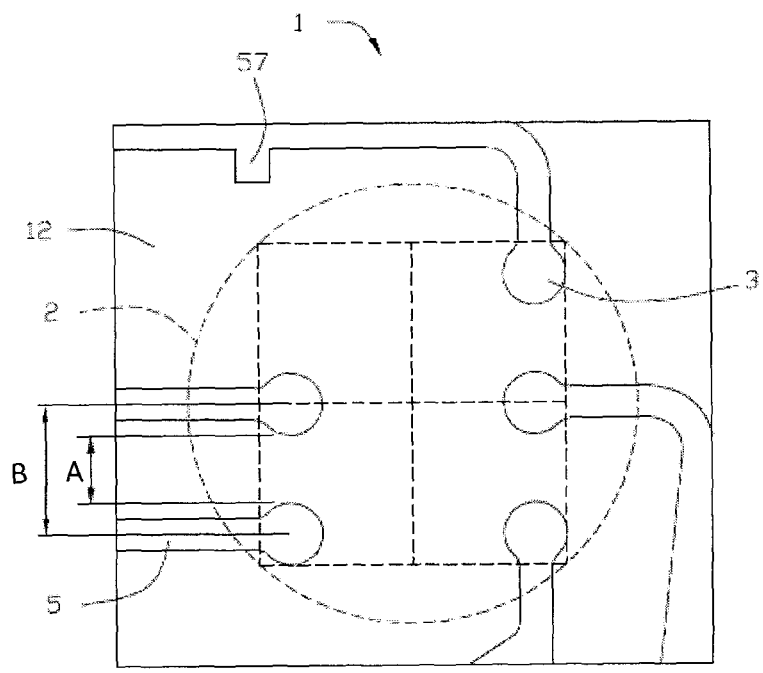
FIG. 1 is a top plan view of a circuit board according to a first embodiment of the present invention.

FIG. 1 is a schematic plan view of a circuit board 1 according to one embodiment of the present invention. The circuit board 1 is preferred a flexible printed circuit (FPC) board, may be used in smart cards, or other electronic devices, such as cell phones, notebook computers, tablet PCs, LCDs, televisions, or electronic components in other electronic devices. In this embodiment, the circuit board 1 is preferably suitable for use in a smart card module. A chip (not shown) is assembled as a flip-chip. The circuit board 1 may also be provided with other necessary electronic components to form the smart card module. The smart card module is then disposed on a card body 10 (FIG. 7) to form a complete smart card product.

The smart card includes at least one plastic board body (card body 10) and a smart card module, i.e. the circuit board 1 and the electronic components on the circuit board 1, mounted on the board body. It should be understood that, in order to reduce the thickness of the smart card, the card body may define a mounting groove that matches with the smart card module in thickness and shape. In some embodiment, the board body may include antennas that connect with the smart card module, thus achieving wireless communication function of the smart card. In some other embodiments, the antennas may be mounted in the smart card module at a side opposite from the chip mounting side, thus improving the manufacturing procedure.

The circuit board 1 includes at least one pad region 2 (as indicated by the circular region enclosed by dotted line broken line in the FIG. 1). A plurality of pads 3 (connecting pads) and a plurality of traces 5 are formed in the pad region 2. Each pad 3 is connected with one trace 5. The trace 5 is used to connect the electronic component (such as chip) mounted in the pad region 2 to another electronic component or an contact pad formed on the opposite side of the circuit board 1. The pads 3 are connected to the chip using a flip-chip process.

It should be understood that, the number of the pads 2 and traces 5 may be determined based on the number of pins of the chip (not shown) soldered to the pad region 2. The number of the chip pins is specified in relevant ISO standards. In this embodiment, there are five pads 3 and five traces 5, with three pads 3 arranged in a row and uniformly spaced from each other, and the other two pads 3 arranged in another parallel row.

The circuit board 1 includes at least one substrate 12. In this embodiment, the substrate 12 is made of polyethylene terephthalate (PET). The pads 3 are disposed in the pad region 2 on the substrate 12 of the circuit board 1. In this embodiment, a material of the pads 3 and traces 5 is copper foil with a nickel layer coated thereon. The circuit board 1 is a dual-layer circuit board (double-sided circuit board). At least one side of the substrate 12 of the circuit board 1 is mounted with the pads 3 and traces 5. The other side may also be provided with the pads and traces. In this embodiment, by way of example, the pads 3 and traces 5 are illustrated as being mounted at the same side of the substrate 12.

It should be understood that, the pads 3 and traces 5 may be formed by printing conducting materials in the pad region 2. Alternatively, the pads 3 and traces 5 may be formed at preset locations of the pad region 2 by plating and etching.

In this embodiment, at least one of the plurality of pads 3 is round. In comparison with the ordinary square pad, the gap between two round pads 3 is reflected by a distance between two nearest points of two adjacent round pads 3, the distance is easy to be controlled during fabrication. Under the condition of the same fabrication tolerance, the distance between adjacent pads 3 can be reduced, then the reduced distance between adjacent pads 3 facilitates better layout of the circuit board 1. The chip pad pitch can decrease to allow for reduced chip size and hence reduced space to be occupied in the electronic device. In addition, the round pad 3 has the same size as an inscribed circle of the square of the square pad and, therefore, consumes less material. A minimum value of the distance A between two adjacent pads 3 can reach 40 μm. In other words, the distance A is greater than or equal to 40 μm, can be 40 μm. A minimum value of the distance B between centers of two adjacent pads 3 can reach 142 μm. In other words, the distance B is greater than or equal to 142 μm, can be 177 μm.

Figure 2:
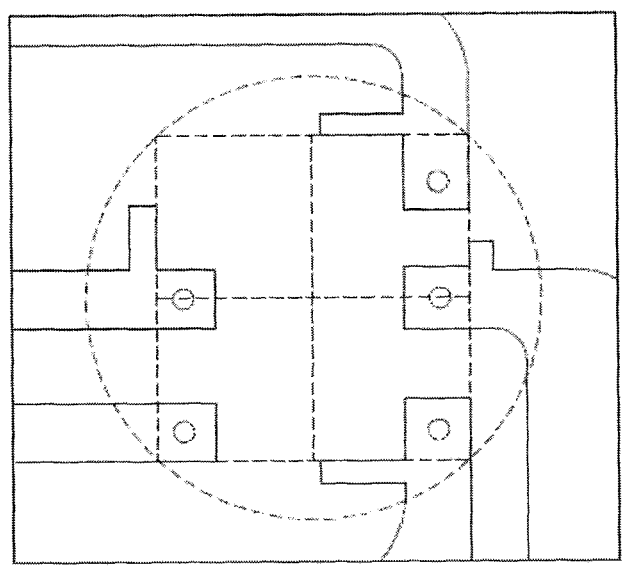
FIG. 2 is a top view of a conventional circuit board.

Furthermore, as shown in FIG. 2, in the round pad region of the conventional circuit board with square pads, the area of the copper foils occupies 24.4% of the total pad region.

Referring to FIG. 1, however, in the circuit board 1 having the round pads 3 according to this embodiment of the present invention, under the conditions that the pads 3 are arranged in the same layout and the pad region 2 has the same area, the area of the copper foils occupies 13% of the total pad region 2. Obviously, the copper foils occupy less area in the pad region 2 of the circuit board of this embodiment of the present invention. Therefore, more adhesive may be applied on a greater area of the substrate 12 (PET film), which enhances the structure stability of the chip and the pad region 2.

It should be understood that the shape of the pads 3 is not limited to circle. The shape of the pads also can be ellipse. As long as the pads have an arc edge, the gap between two adjacent pads can be reflected by a distance between two nearest points of two adjacent pads, the distance is easy to be controlled during fabrication. As such, under the condition of the same fabrication tolerance, the distance between adjacent pads can be reduced, then the reduced distance between adjacent pads facilitates better layout of the circuit board.

FIG. 3 to FIG. 8 illustrate other embodiments according to another concept of the present invention. At least one trace 5 extends to form an extension 56. The extension 56 extends from a portion of the associated trace 5 adjacent the pad 3 toward one adjacent trace 5 along a perimeter of the pad region 2, until reaching a position closing to the adjacent trace 5. It should be understood that the extension 56 of each trace 5 is insulated from any of the other traces.

Figure 8:
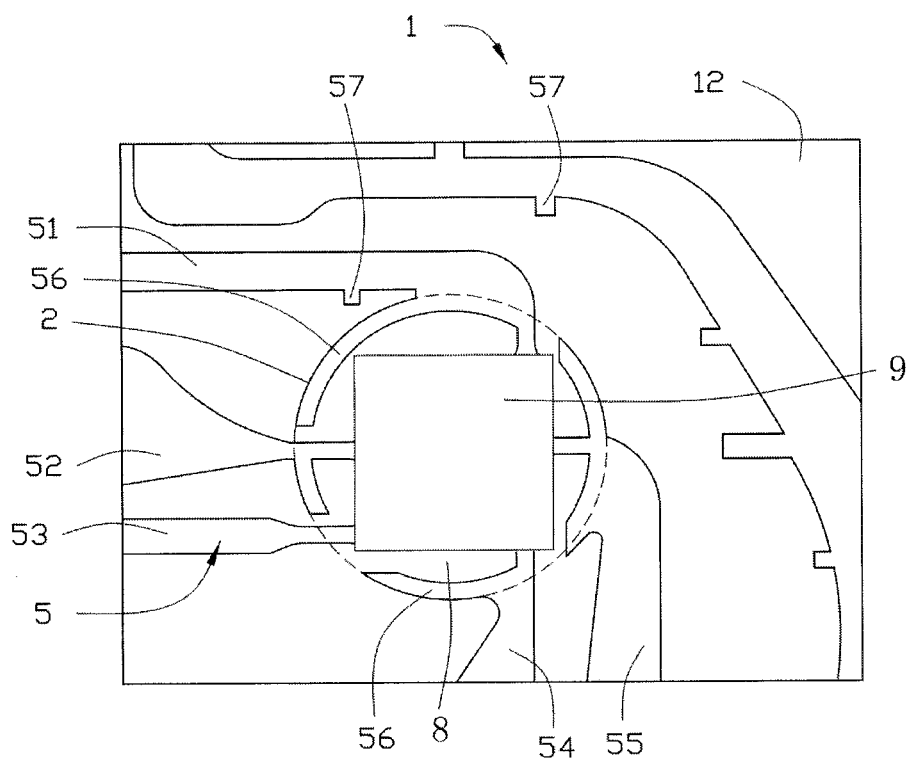
FIG. 8 is a top plan view of the circuit board of FIG. 5 with a chip mounted thereon.

The extensions 56 extending along the perimeter of the pad region 2 cooperatively define the perimeter of the pad region 2. Therefore, during the course of applying an adhesive layer 8 (as shown in FIG. 8) for bonding the chip 9 (as shown in FIG. 8) in the pad region 2, the adhesive layer 8 can flow along the pad region 2 and can be uniformly applied in the pad region 2 under the guiding and blocking of the plurality of extensions 56. The extensions 56 can block the adhesive layer 8 from flowing to an area outside the pad region 2, thus avoiding non-uniform applying and arbitrary flowing of the adhesive layer 8. In this embodiment, a thickness of the extension 56 protruding beyond the surface of the substrate 12 is 10 μm-15 μm and, preferably, 10 μm. The material of the extensions 56 is the same as the material of the traces 5. In another embodiment of the present invention, the extensions 56 may also be made of PET, another metal material or plastic.

It should be understood that the pad region 2 may be of any shape such as round, rectangle or polygon depending upon the shape of the chip. Accordingly, the region that is cooperatively defined by the plurality of extensions 56 is in the shape of round, rectangle or polygon. In this embodiment, the shape of the pad region 2 is round.

Figure 3:
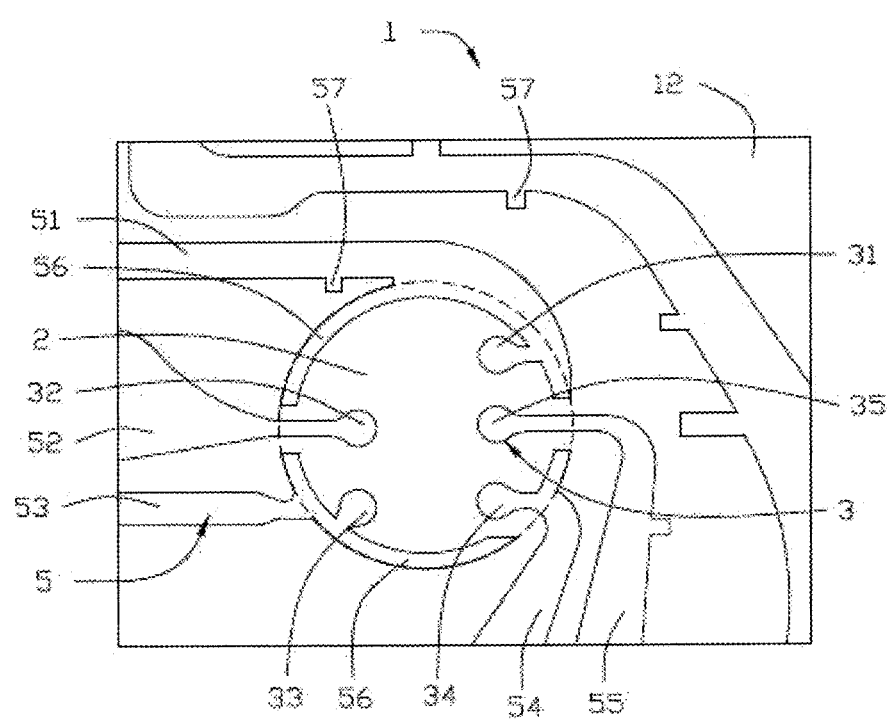
FIG. 3 is a top plan view of a circuit board according to a second embodiment of the present invention.

Referring to FIG. 3, in a second embodiment of the present invention, the circuit board 1 includes a first pad 31, a second pad 32, a third pad 33, a fourth pad 34, a fifth pad 35, and a first trace 51, a second trace 52, a third trace 53, a fourth trace 54 and a fifth trace 55 that are connected to the pads, respectively. In this embodiment, two extensions 56 extend from each of the first trace 51 and third trace 53 at a position adjacent the associated pad toward opposite sides, respectively, and an extension 56 extends from the fourth trace 54 toward the fifth trace 55.

The two extensions 56 connected to the first trace 51 are in the form of a longer arc and a shorter arc, with the longer extension 56 extending toward the second trace 52 and the shorter extension 56 extending to the fifth trace 55. The longer extension 56 partially overlaps with the first trace 51.

The two extensions 56 connected to the third trace 53 are in the form of a longer arc and a shorter arc, with the shorter extension 56 extending toward the second trace 52 and the longer extension 56 extending to the fourth trace 54.

The shorter extension 56 connected to the first trace 51, the extension 56 connected to the fourth trace 54, and the shorter extension 56 connected to the third trace 53 are the same in length and radians.

The extensions 56 cooperatively define a non-closed circle along the pad region 2. The second trace 52 is disposed in a gap between the longer extension 56 connected to the first trace 51 and the shorter extension 56 connected to the third trace 53. The fifth trace 55 is disposed in a gap between the shorter extension 56 connected to the first trace 51 and the extension 56 connected to the fourth trace 54. The portion of each trace within the pad region 2 has the same width. The portions of the traces connected to the corresponding pads adjacent the perimeter of the pad region 2 are substantially parallel to each other.

Figure 4:
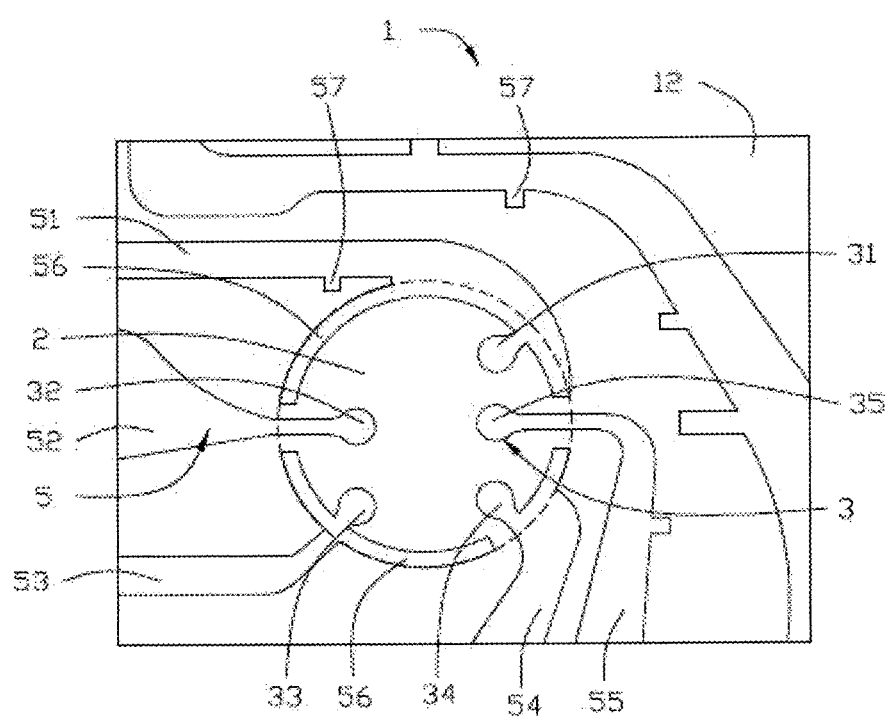
FIG. 4 is a top plan view of a circuit board according to a third embodiment of the present invention.

Referring to FIG. 4, a third embodiment of the present invention differs from the second embodiment of the present invention in that, the portions of the first trace 51, the third trace 53 and the fourth trace 54 adjacent the perimeter of the pad region 2 extend in radial directions of the circle within which the pad region 2 is located.

Figure 5:
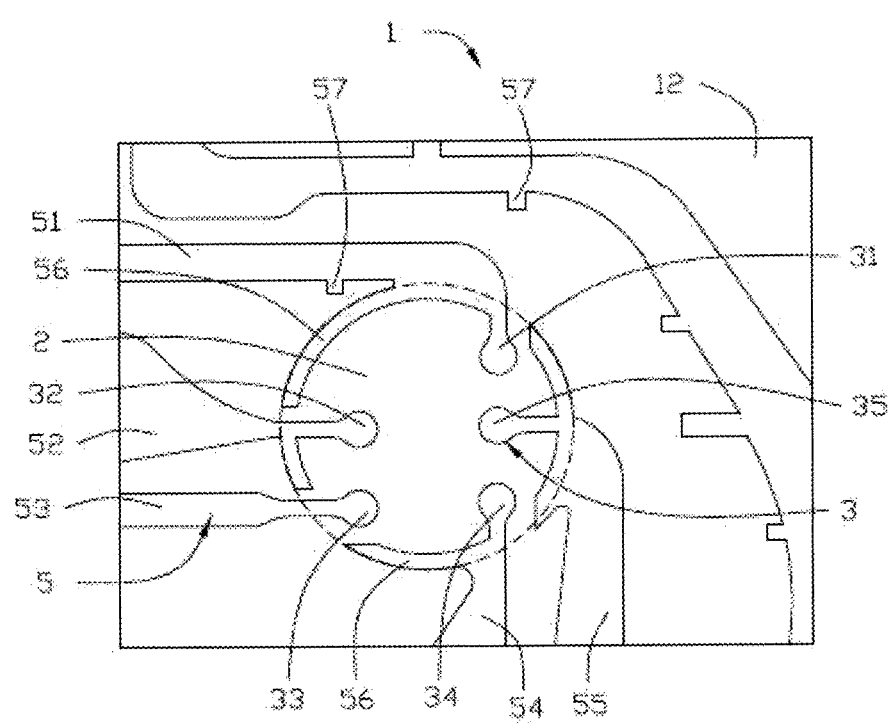
FIG. 5 is a top plan view of a circuit board according to a fourth embodiment of the present invention.

Referring to FIG. 5, in a fourth embodiment of the present invention, the circuit board 1 includes a first pad 31, a second pad 32, a third pad 33, a fourth pad 34, a fifth pad 35, and a first trace 51, a second trace 52, a third trace 53, a fourth trace 54 and a fifth trace 55 that are connected to the pads, respectively. In this embodiment, an extension 56 extends from each of the first trace 51, the second trace 52, and a fourth trace 53 at a position adjacent the associated pad toward one side, and two extensions 56 extend from the fifth trace 55 at a position adjacent the fifth pad 35 toward opposite sides, respectively.

The extension 56 formed on the first trace 51 extends toward the second trace 52, the extension 56 formed on the second trace 52 extends toward the third trace 53, and the extension 56 connected to the fourth trace 54 extends toward the third trace 53.

The two extensions 56 formed on the fifth trace 55 extend toward the adjacent first trace 51 and fourth trace 54, respectively.

The extensions 56 cooperatively define a non-closed circle along the pad region 2. The third trace 53 is disposed in a gap between the extension 56 connected to the second trace 52 and the extension 56 connected to the fourth trace 54. The portion of each trace within the pad region 2 has the same width. The portions of traces connected to the second, third and fifth pads 32, 33, and 35 adjacent the perimeter of the pad region 2 are substantially parallel to each other. The portions of traces connected to the first and fourth pads 31 and 34 adjacent the perimeter of the pad region 2 are substantially parallel to each other and are perpendicular to the portions of traces connected to the second, third and fifth pads 32, 33, and 35 adjacent the perimeter of the pad region 2. The extensions connected to opposite sides of the fifth traces 55 are the same in length and radians, such that the distance between the first and fifth pads 31, 35 is the same as the distance between the fourth and fifth pads 34, 35.

It should be understood that the size of the pad 3 on the circuit board 1 depends on the fabrication tolerance and the size of the gold ball (not shown) on the pad 3 for soldering the chip. In the case of large fabrication tolerance and low assembly precision, the size of the pad 3 may increase; in the case of small fabrication tolerance and high assembly precision, the size of the pad 3 may decrease. The size of the pad 3 is directly proportional to the size of the gold ball.

Referring to FIG. 3, the circuit board 1 further includes at least a group of positioning marks 57. The group of positioning marks 57 includes at least two positioning marks. In this embodiment, the number of the positioning marks 57 is four. The positioning marks 57 and the traces 5 can be formed together. The positioning marks 57 facilitate a chip precisely identifying the mounting position of the chip on the circuit board 1. When the chip is placed on the circuit board 1, an operator observes the precision position of the chip through a display and can know whether the position of the chip deviates by means of the positioning marks. In this embodiment, the positioning marks 57 are made of the same material as the traces 5, and are formed on the traces 5 at positions away from the pad region 2 to further reduce the copper foil area in the pad region 2.

Figure 6:
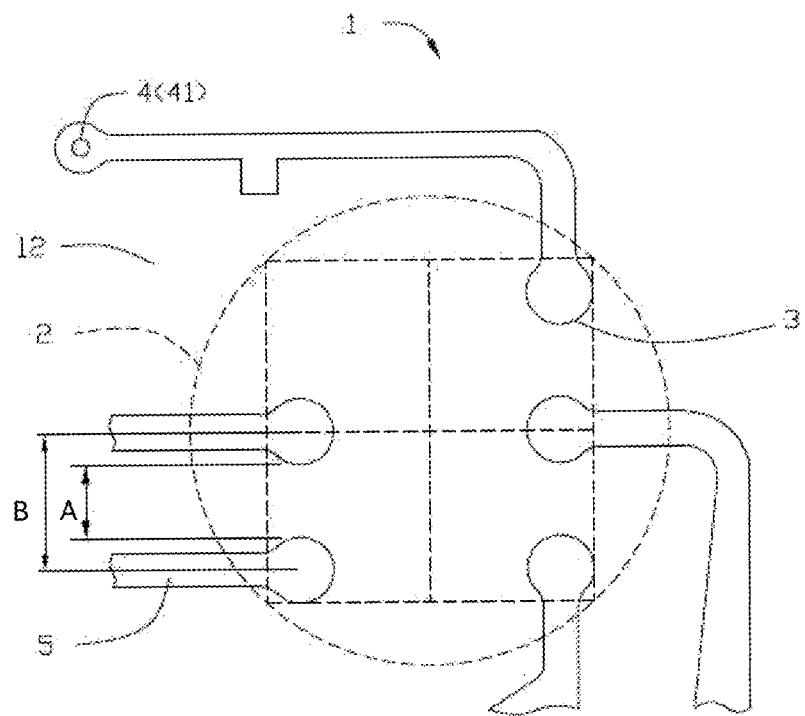
FIG. 6 is another top plan view of the circuit board according to the first embodiment of the present invention.

Referring to FIG. 6, in this embodiment, the trace 5 defines a via hole 4 passing through the substrate 12. The via hole 4 is defined at a position of the trace 5 away from the pad region 2, and the size of the trace 5 at the position where the via hole 4 is defined is greater than the size of portions of the trace 5 where no via hole is defined. The via hole 4 is filled with a conducting medium. Preferably, the conducting medium and the pad 3 are made of the same material. The via hole 4 can connect the pad 3 to another pad 3 or trace 4 at a different layer of the circuit board 1, such that signals transmitted through the pad 3 can be transmitted between different layers.

It should be understood that the circuit board 1 may also be a single sided circuit board, and the pads 3 and traces 5 are disposed on the outer surface of the same side of the circuit board 1.

It should be understood that the circuit board 1 may also be a dual-layer circuit board. One layer provided with pads and traces for connecting the chip. Another layer provided with contact pads in communication with electronic devices. For example, the circuit board 1 includes at least two stacked substrates 12 with an adhesive layer filled therebetween. The pads 3 and traces 5 are formed on an outermost layer of the circuit board 1. The trace 5 in the circuit of the outmost layer of the circuit board 1 defines a blind via or through hole 41 passing through the circuit board 1. In this embodiment, the through hole 41 is defined at a position of the trace away from the pad region 2, and the size of the trace 5 at the position where the through hole is defined is greater than the size of portions of the trace 5 where no through hole 41 is defined. The through hole 41 is filled with a conducting medium. Preferably, the conducting medium and the pad 3 are made of the same material, i.e. copper foil. The via hole 41 can connect the pad 3 to another pad or trace at a different layer of the circuit board 1, such that signals transmitted through the pad 3 can be transmitted between different layers.

The circuit board 1 of the present invention uses round pads 3, such that the copper foils occupy less area in the pad region 2, leaving more space for the PET film. Therefore, during the course of mounting the chip to the pad region 2, the PET film with greater area allows for more adhesive to be applied thereon, which enhances the structural stability of the chip and pad region 2.

Figure 7:
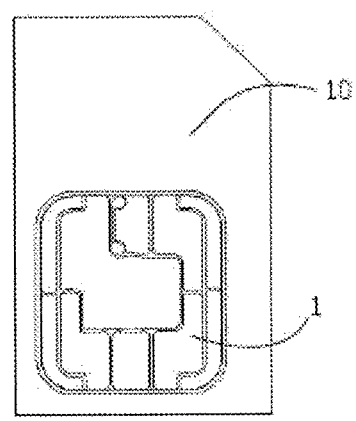
FIG. 7 illustrates a smart card product according to one embodiment of the present invention.

FIG. 7 illustrates the application of the smart card module mounted to a smart card according to one embodiment of the present invention. In this figure, the card body 10 is a plastic base plate with a hollow groove defined in a middle portion thereof. One side of the circuit board 1 is mounted with a chip (not shown), and the other side is provided with smart card contact terminals (as shown in the figure) according to the SIM card standard to form a smart card module. The smart card module is then mounted in the card body 10 to form a complete smart card.

Although the invention is described with reference to one or more embodiments, the above description of the embodiments is used only to enable people skilled in the art to practice or use the invention. It should be appreciated by those skilled in the art that various modifications are possible without departing from the spirit or scope of the present invention. The embodiments illustrated herein should not be interpreted as limits to the present invention, and the scope of the invention is to be determined by reference to the claims that follow.

The invention claimed is:

1. A circuit board comprising:
a substrate; and
a pad region provided on the substrate, the pad region configured for forming an adhesive layer to bond a flip chip, the pad region comprising a plurality of pads spaced from each other and traces connected to their respective pads,
wherein the circuit board further comprises a barrier formed along a perimeter of the pad region, and the barrier is substantially ring-shaped and surrounds the chip, configured for guiding and blocking the adhesive layer from flowing to an area outside the pad region, so that the adhesive layer is capable of being uniformly formed in the pad region.

2. The circuit board of claim 1, wherein the substantially ring-shaped barrier is non-closed and comprises a plurality of disconnected blocking portions, each blocking portion is formed by extending from a corresponding trace, and the blocking portions and the traces are formed from same material.

3. The circuit board of claim 1, wherein the circuit board is a flexible printed circuit board.

4. The circuit board of claim 1, wherein the barrier is substantially circular ring-shaped, rectangular ring-shaped, or polygonal ring-shaped.

5. The circuit board of claim 1, wherein a thickness of the blocking portion is in the range of 10 µm to 15 µm.

6. The circuit board of claim 1, wherein a thickness of the blocking portion is 10 µm.

7. The circuit board of claim 1, wherein the circuit board further comprises a group of positioning marks, and each of the positioning marks is formed at a position away from the pad region.

8. The circuit board of claim 7, wherein the group of positioning marks include four positioning marks.

9. The circuit board of claim 1, wherein each of the pads of the pad region is a round pad.

10. The circuit board of claim 1, wherein a distance between centers of two adjacent pads is greater than or equal to 142 µm.

11. The circuit board of claim 10, wherein the distance is 177 µm.

12. The circuit board of claim 1, wherein portions of all traces within the pad region have the same width.

13. The circuit board of claim 1, wherein a distance between two adjacent pads is greater than or equal to 40 µm.

14. The circuit board of claim 13, wherein the distance is 75 µm.

15. The circuit board of claim 1, wherein at least one of the traces is formed with a via hole passing through the substrate, the via hole is filled with a conducting medium, and the via hole is formed outside the barrier.

16. A smart card module comprising:
a chip; and
a circuit board comprising:
a substrate;
a pad region provided on the substrate, the pad region configured for mounting the chip by flip chip bonding, the pad region comprising a plurality of pads spaced from each other and traces connected to their respective pads, and
an adhesive layer is formed in the pad region for bonding the chip,
wherein the circuit board further comprises a barrier forming along a perimeter of the pad region, and the barrier is substantially ring-shaped and surrounds the chip, configured for guiding and blocking the adhesive layer from flowing to an area outside the pad region, so that the adhesive layer is capable of being uniformly formed in the pad region.

17. The smart card module of claim 16, wherein the substantially ring-shaped barrier is non-closed and comprises a plurality of disconnected blocking portions, each blocking portion is formed by extending from a corresponding trace, and the blocking portions and the traces are formed from same material.

18. A smart card comprising:
a card body defining a groove; and
a smart card module disposed in the groove of the card body, the smart card module comprising:
a chip; and
a circuit board comprising:
a substrate;
a pad region provided on the substrate, the pad region configured for mounting the chip by flip chip bonding, the pad region comprising a plurality of pads spaced from each other and traces connected to their respective pads, and
an adhesive layer is formed in the pad region for bonding the chip,
wherein the circuit board further comprises a barrier formed along a perimeter of the pad region, and the barrier is substantially ring-shaped and surrounds the chip, configured for guiding and blocking the adhesive layer from flowing to an area outside the pad region, so that the adhesive layer is capable of being uniformly forming in the pad region.

19. The smart card of claim 18, wherein the substantially ring-shaped barrier is non-closed and comprises a plurality of disconnected blocking portions, each blocking portion is formed by extending from a corresponding trace and the blocking portions and the traces are formed from same material.

* * * * *